US012147691B2

(12) United States Patent
Avila-Hernandez et al.

(10) Patent No.: US 12,147,691 B2
(45) Date of Patent: Nov. 19, 2024

(54) BANK REMAPPING BASED ON SENSED TEMPERATURE

(71) Applicant: Micron Technology, Inc., Boise, ID (US)

(72) Inventors: Rosa M. Avila-Hernandez, Boise, ID (US); Rachael R. Skreen, Meridian, ID (US); Ji-Hye G. Shin, Palo Alto, CA (US); Kazuaki Ohara, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 285 days.

(21) Appl. No.: 17/345,249

(22) Filed: Jun. 11, 2021

(65) Prior Publication Data

US 2022/0398026 A1    Dec. 15, 2022

(51) Int. Cl.
*G06F 3/06* (2006.01)

(52) U.S. Cl.
CPC .......... *G06F 3/0635* (2013.01); *G06F 3/0625* (2013.01); *G06F 3/0679* (2013.01)

(58) Field of Classification Search
CPC ................ G06F 3/0635; G06F 3/0625; G11C 11/40626
See application file for complete search history.

(56) References Cited

U.S. PATENT DOCUMENTS

| 8,767,491 | B1  | 7/2014  | Wu |
| 9,195,577 | B2  | 11/2015 | Saraswat |
| 9,342,443 | B2  | 5/2016  | Walker |
| 9,396,787 | B2  | 7/2016  | Shoemaker |
| 2015/0091638 | A1* | 4/2015 | Carlson ..................... G05F 5/00 327/540 |
| 2016/0124873 | A1* | 5/2016 | Xu ........................ G06F 12/023 711/167 |
| 2016/0203854 | A1* | 7/2016 | Kim ........................ H01L 25/18 365/222 |
| 2017/0060425 | A1* | 3/2017 | Sunata ................... G11C 16/10 |
| 2020/0042197 | A1* | 2/2020 | Kotra .................... G06F 3/0647 |

* cited by examiner

*Primary Examiner* — Ernest Unelus
(74) *Attorney, Agent, or Firm* — Brooks, Cameron & Huebsch, PLLC

(57) ABSTRACT

Memory bank remapping based on sensed temperatures of a memory device can provide an overall reduced power consumption of the memory device. Signaling indicative of sensed temperatures detected by a plurality of temperature sensors within a stack of memory dies of a memory device can be received by address circuitry of the memory device. Based on the sensed temperatures and respective positions of the temperature sensors within the stack of memory dies, a portion of the memory device experiencing an excessive operating temperature can be identified. Logical addresses of a first memory bank of a memory die of the stack of memory dies near or at least partially within the identified portion can be remapped to physical addresses of a second memory bank of the memory die that is further away from the identified portion than the first memory bank.

22 Claims, 7 Drawing Sheets

BANK REMAPPING BASED ON SENSED TEMPERATURE

TECHNICAL FIELD

The present disclosure relates generally to memory devices, and more particularly, to apparatuses and methods related to memory bank remapping based on sensed temperatures.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Volatile memory and/or non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
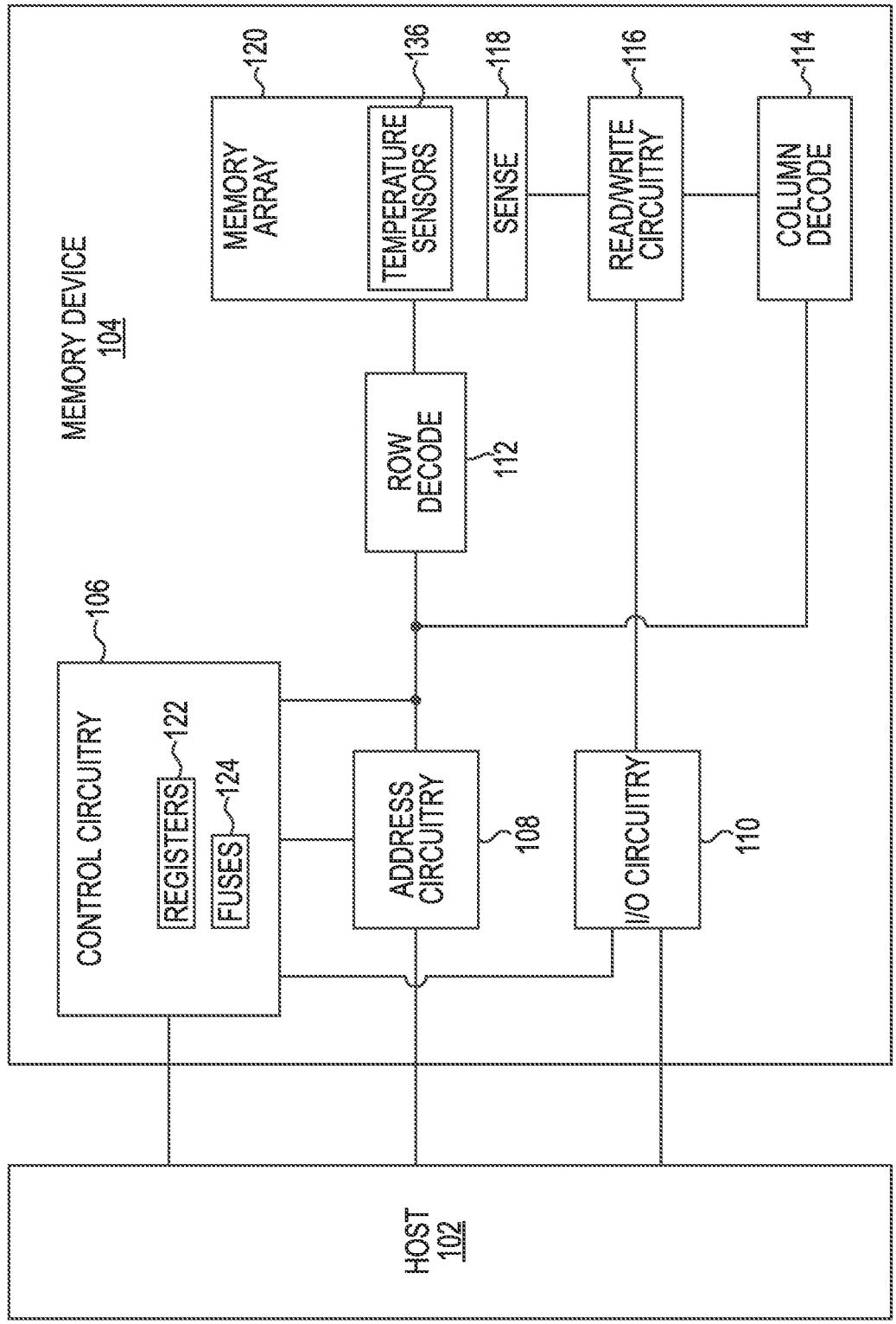
FIG. 1 is a block diagram of an apparatus in the form of a memory device according to the present disclosure.

The present disclosure includes apparatuses and methods related to memory bank remapping based on sensed temperatures. As used herein, "sensed temperature" refers to a temperature detected by a temperature sensor. As described herein, embodiments of the present disclosure include memory devices having one or more temperature sensors disposed on one or more memory dies. A temperature detected by such a temperature sensor is an example of a sensed temperature. As used herein, "operating temperature" refers to a temperature of a portion of a memory device during operation of the memory device. Non-limiting examples of a portion of a memory device include a component of the memory device (e.g., a memory bank) and a region of the memory device. A sensed temperature can be indicative of an operating temperature.

Operating temperatures of a memory device can change based on external factors, such as an environment in which the memory device operates, and/or internal factors, such as speed and/or performance of the memory device. The operating temperature of a memory device can change throughout operation of the memory device. Increases and decreases in usage of a memory bank can directly correlate to increase and decreases, respectively, of operating temperatures of the memory device at and/or near the physical location of the memory bank within the memory device. For example, a memory bank that is accessed frequently (e.g., frequently read from and/or frequently written to) may have a higher operating temperature than another memory bank that is not accessed as frequently. Refresh rates of the memory device may be increased to compensate for effects of increased operating temperatures. However, increasing refresh rates of a memory device may cause power consumption of the memory device to increase, which in turn can cause operating temperatures of the memory device to increase. Thus, increasing refresh rates of a memory device to compensate for effects of the increased operating temperatures may further increase operating temperatures of the memory device and increase the power consumption of the memory device.

Additional power savings in memory operations is desired in memory solutions that support wide and varying applications. Such power savings may be emphasized for mobile devices and/or automotive use of memory devices. For example, with respect to the use of memory devices in the automotive space, software updates may be implemented while the automobile is not connected to an external power supply (e.g., when the automobile is draining its battery). Any power savings that can be achieved (including memory components of the automobile) are desirable to improve the overall battery life and thus performance of the system.

Some memory devices are provided with a common or similar physical layout of memory banks for differing speeds and technologies of the memory device. For example, subsequent generations of a low power DRAM (LPDRAM) memory device may use the same physical layout of memory banks even if the process by which the banks were fabricated changed between generations. As another example, different memory devices that operate at different speeds may have a common or similar physical layout of memory banks.

Various solutions have been proposed or used to reduce power consumption. Some approaches designed to achieve power savings during operation of memory devices trade performance (e.g., reduced speed) of the memory devices in favor of lesser power consumption of the memory devices. For example, operating voltages or frequencies may be reduced, delay-locked loops (DLLs) may be removed, etc. Some approaches seek reduced power consumption by adding functionality to the memory device (e.g., temperature compensated self-refresh, partial array self-refresh, deep power down, etc.). Some approaches reduce drive strength (e.g., reduce alternating current (AC) switching current or provide a lower power consuming interface). Some approaches seek to reduce bus loading (e.g., package-on-package structure, data bus inversion, lower common input/output (CIO), etc.).

In order to address these and other issues associated with some previous approaches, at least one embodiment of the present disclosure includes a memory devices having multiple temperature sensors (e.g., one or more temperature sensors disposed on memory dies of the memory device). The temperature sensors and respective locations of the temperature sensors within the memory device can be used to identify portions or regions of a memory device experiencing excessive operating temperatures. A portion or region of a memory array or memory device experiencing excessive operating temperatures can be referred to as a "hot spot" of the memory array or memory device.

As used herein, "excessive sensed temperatures" refer to sensed temperatures exceeding a threshold sensed temperature or a threshold sensed temperature differential. As described herein, a threshold sensed temperature or a threshold sensed temperature differential can be a user defined value. For example, excessive sensed temperatures can be defined, by a user, as sensed temperatures that exceed a threshold temperature (e.g., a sensed temperature greater than 150 degrees Fahrenheit) and/or a change in sensed temperatures where the change in the sensed temperatures exceeds a threshold quantity of degrees (e.g., a change in sensed temperatures greater than 30 degrees Fahrenheit). A threshold sensed temperature differential can be relative to an average sensed temperature, for example. The threshold sensed temperature differential can be defined temporally or spatially. Temporally, a threshold sensed temperature differential can be defined a change in temperature of at least a particular quantity of degrees within a particular amount of time. Spatially, a threshold sensed temperature differential can be defined a difference between a sensed temperature from a temperature sensor at a first physical location on a memory die and a sensed temperature from a different temperature sensor at a different physical location on the memory die of at least a particular quantity of degrees. An excessive sensed temperature can be defined as a temperature differential of at least a particular magnitude between a sensed temperature detected by a temperature sensor of a memory die and a sensed temperature detected by another temperature sensor of the same memory die.

At least one embodiment includes remapping logical addresses of memory banks of a memory device experiencing excessive operating temperatures (as indicated by sensed temperatures) to memory banks of the memory device not experiencing excessive operating temperatures (as indicated by sensed temperatures) to reduce operating temperatures and/or power consumption of the memory device. Logical addresses of a memory bank of a memory die near or adjacent to a temperature sensor indicating an excessive sensed temperature (e.g., a high temperature memory bank) can be remapped to another memory bank of the memory die near or adjacent to a temperature sensor not indicating an excessive sensed temperature (e.g., a low temperature memory bank). Frequent reading from and/or writing to a memory bank can cause the operating temperature of that memory bank, and components near that memory bank, to increase. A memory bank not experiencing excessive operating temperatures may be a lesser used (e.g., not read from or written to frequently) memory bank such that the memory has available physical addresses. Thus, remapping logical addresses of memory banks of experiencing excessive operating temperatures to memory banks of not experiencing excessive operating temperatures can distribute heat generation and power consumption of the memory device to avoid "hot spots." Some embodiments provide a capability for a memory chip (e.g., a memory array, a stack of memory dies) to employ power saving methods described herein. Additional embodiments and advantages are described in more detail below.

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 120 may reference element "20" in FIG. 1, and a similar element may be referenced as 320 in FIG. 3. Analogous elements within a Figure may be referenced with a hyphen and extra numeral or letter. Such analogous elements may be generally referenced without the hyphen and extra numeral or letter. For example, elements 232-0, 232-1, . . . , 232-7 in FIGS. 2A-2B may be collectively referenced as 232. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of an apparatus in the form of a memory device 104 according to the present disclosure. The memory device 104 is coupled to a host 102 via an interface. As used herein, a host 102, a memory device 104, or a memory array 120, for example, might also be separately considered to be an "apparatus." The interface can pass control, address, data, and other signals between the memory device 104 and the host 102. The interface can include a command bus (e.g., coupled to the control circuitry 106), an address bus (e.g., coupled to the address circuitry 108), and a data bus (e.g., coupled to the input/output (I/O) circuitry 110). In some embodiments, the command bus and the address bus can be comprised of a common command/address bus. In some embodiments, the command bus, the address bus, and the data bus can be part of a common bus. The command bus can pass signals between the host 102 and the control circuitry 106 such as clock signals for timing, reset signals, chip selects, parity information, alerts, etc. The address bus can pass signals between the host 102 and the address circuitry 108 such as logical addresses of memory banks in the memory array 120 for memory operations. The interface can be a physical interface employing a suitable protocol. Such a protocol may be custom or proprietary, or the interface may employ a standardized protocol, such as Peripheral Component Interconnect Express (PCIe), Gen-Z interconnect, cache coherent interconnect for accelerators (CCIX), etc. In some cases, the control circuitry 106 is a register clock driver (RCD), such as an RCD employed on a registered dual in-line memory module (RDIMM) or load-reduction DIMM (LRDIMM).

The memory device 104 and host 102, together, can be a personal laptop computer, a desktop computer, a digital camera, a mobile telephone, a memory card reader, an Internet-of-Things (IoT) enabled device, and/or an automobile, among various other types of systems. For clarity, the system illustrated by FIG. 1 has been simplified to focus on features with particular relevance to the present disclosure. Although not specifically illustrated, the host 102 can include a number of processing resources (e.g., one or more processors, microprocessors, and/or some other type of controlling circuitry) capable of accessing the memory device 104.

The memory device 104 can provide main memory for the host 102 or can be used as additional memory or storage for the host 102. By way of example, the memory device 104 can be a DIMM including memory devices 104 operated as double data rate (DDR) DRAM, such as DDR5, a graphics DDR DRAM, such as GDDR6, or another type of memory system. Embodiments are not limited to a particular type of memory device 104. Other examples of memory devices 104 include RAM, ROM, SDRAM, LPDRAM, PCRAM, RRAM, flash memory, lower-power double data rate synchronous dynamic random access memory, and three-dimensional cross-point, among others. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The control circuitry 106 can decode signals provided by the host 102. The control circuitry 106 can also be referred to as a command input and control circuit and can represent the functionality of different discrete application specific integrated circuits (ASICs) or portions of different ASICs depending on the implementation. The signals can be commands provided by the host 102. These signals can include chip enable signals, write enable signals, and address latch signals, among others, that are used to control operations performed on the memory array 120. Such operations can include data read operations, data write operations, data erase operations, data move operations, etc. The control circuitry 106 can comprise a state machine, a sequencer, and/or some other type of control circuitry, which may be implemented in the form of hardware, firmware, or software, or any combination thereof.

Data can be provided to and/or from the memory array 120 via data lines coupling the memory array 120 to I/O circuitry 110 via read/write circuitry 116. The I/O circuitry 110 can be used for bi-directional data communication with the host 102 over an interface. The read/write circuitry 116 is used to write data to the memory array 120 or read data from the memory array 120. As an example, the read/write circuitry 116 can comprise various drivers, latch circuitry, etc. In some embodiments, the data path can bypass the control circuitry 106.

As described in association with FIGS. 2A-4B, the memory array 120 can include a plurality of memory banks on one or more memory dies. The memory array 120 can include memory dies arranged in a stack. The memory banks of the memory array 120 can comprise memory cells arranged in rows coupled by access lines (which may be referred to herein as word lines or select lines) and columns coupled by sense lines (which may be referred to herein as digit lines or data lines). The memory array 120 can include volatile memory cells (e.g., DRAM memory cells, among other types of volatile memory cells) and/or non-volatile memory cells (e.g., RRAM memory cells, among other types of non-volatile memory cells). Although the memory array 120 is shown as a single memory array, the memory array 120 can represent a plurality of memory arrays (e.g., a plurality of stacks of memory dies).

The memory array 120 can include one or more temperature sensors 136. As described in association with FIGS. 2A-4B, the temperature sensors 136 can be disposed on memory dies of the memory array 120. The temperature sensors 136 can be positioned within the memory array 120 (e.g., within a stack of memory dies) to provide temperature monitoring capability throughout the memory array 120.

The memory device 104 includes address circuitry 108 to latch address signals provided over an interface. Address signals are received and decoded by a row decoder 112 and a column decoder 114 to access the memory array 120. Data can be read from memory array 120 by sensing voltage and/or current changes on the sense lines using sensing circuitry 118. The sensing circuitry 118 can be coupled to the memory array 120. The sensing circuitry 118 can comprise, for example, sense amplifiers that can read and latch a page (e.g., row) of data from the memory array 120. Sensing (e.g., reading) a bit stored in a memory cell can involve sensing a relatively small voltage difference on a pair of sense lines, which may be referred to as digit lines or data lines.

The address circuitry 108 can receive signaling from the temperature sensors 136 indicative of sensed temperatures, which can correspond to and/or be indicative of operating temperatures of the memory array 120, or components and/or portions thereof. The address circuitry 108 can include an ASIC and/or programmable logic to identify "hot spots" of the memory array 120 based on signaling from the temperature sensors 136 and respective positions of the temperature sensors 136 within the memory array 120. A "hot spot" can be identified by one or more of the temperature sensors 136 detecting an excessive sensed temperature. The address circuitry 108 can remap logical addresses mapped to physical addresses near or within a "hot spot" to physical addresses away from the "hot spot." A physical address, memory cell, row of memory cells, and/or column of memory cells "being within a 'hot spot'" can refer to a physical address of a memory bank of a memory die being no more than a threshold number of physical addresses, memory cells, rows of memory cells, and/or columns of memory cells away from a different physical address, memory cell, row of memory cells, and/or column of memory cells experiencing an excessive operating temperature (e.g., as indicated by one of the temperature sensors 136 indicating an excessive sensed temperature).

In at least one embodiment, in response to one or more of the temperature sensors 136 indicating an excessive sensed temperature, the address circuitry 108 can remap logical addresses of a memory bank of the memory array 120 near those temperature sensors to a different memory bank of the memory array 120 that is further from that temperature sensor than the memory bank. The address circuitry 108 can remap logical addresses back to a previous memory bank in response to a temperature sensor corresponding to the previous memory bank no longer indicating an excessive sensed temperature. The previous memory bank can be a default memory bank or, in cases where logical addresses have been remapped to multiple different memory banks other than an initial (e.g., default) memory bank, a memory bank to which the logical addresses were previously remapped. In some embodiments, a user can monitor sensed temperatures indicated by temperature sensors of a stack of memory dies and the user can apply a remapping scheme of memory banks of the stack of memory dies based on the monitored sensed temperatures to more evenly distribute the operating temperatures of the stack of memory dies.

The control circuitry 106 can include a number of registers 122 (e.g., mode registers) and/or fuse options 124 to store default settings for the memory array 120, which can be changed by operation thereof. Although not specifically illustrated, the control circuitry 106 can include an on-die storage array to store and/or change default settings for the memory array 120. The registers 122 can be read and/or written based on commands from the host 102, a controller, and/or control circuitry 106. The registers 122 can include some individual registers that are "reserved for future use" (RFU) as part of a device specification. The RFU registers can be used to fill the role described herein for the registers 122. For example, the registers 122 can, at least initially, store values indicative of default logical to physical address mappings for memory banks of the memory array 120. Those values can be changed by rewriting the registers 122.

The fuse options 124 can represent fuses or anti-fuses (e.g., read only memory with bits set or changed by operation of the fuses or anti-fuses). In some embodiments, the fuse options 124 can be coupled to the registers 122. In some embodiments, the fuse options 124 can include respective fuse options associated with each memory bank of the memory 120. The control circuitry 106 can be configured to activate the respective fuse option 124 associated with a particular memory bank having a particular physical address to remap it from an originally mapped logical address to a different logical address, as described herein.

Figure 2A:
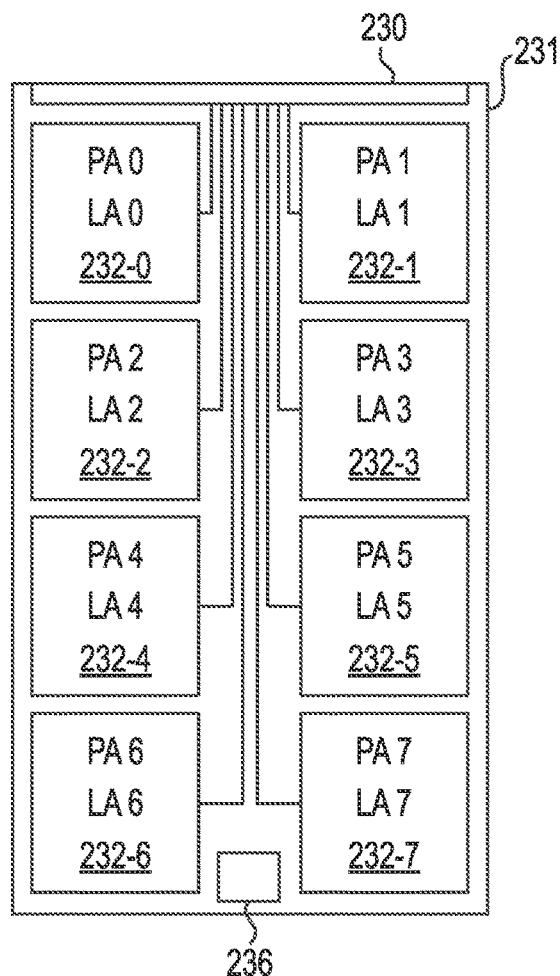
FIG. 2A is a block diagram of a memory die, including a temperature sensor and memory banks, having default logical to physical addressing according to the present disclosure.

FIG. 2A is a block diagram of a memory die 231, including a temperature sensor 236 and memory banks 232-0, 232-1, 232-2, 232-3, 232-4, 232-5, 232-6, and 232-7 (collectively referred to as the memory banks 232), having default logical to physical addressing. The block diagram of the memory die 231 illustrated by FIG. 2A is representative and illustrative of a memory die, but is not intended to imply or limit a shape or size of the memory die, or components thereof. The memory banks 232 can be communicatively coupled to one another via a bus 230. The bus 230 can include an interface, which can be referred to in the art as a contact pad. Each of the memory banks 232 can be individually coupled to the interface, as illustrated. Each of the lines of the bus 230 connecting one of the memory banks 232 to the interface can be referred to in the art as a DQ line. In at least one embodiment, the bus 230 can be a serial bus such that multiple (e.g., all) memory banks 232 of a memory array can be communicated with concurrently. In addition to being used to remap logical addresses of the memory banks 232, the bus 230 can be used for configuration sequences of the memory array.

The temperature sensor 236 detecting an increase in sensed temperature can be indicative of an increase in the operating temperatures of one or more of the memory banks 232. However, because the memory banks 232-6 and 232-7 are adjacent to the temperature sensor 236, an increase in temperature detected by the temperature sensor 236 is likely indicative of an increase in the operating temperatures of the memory bank 232-6 and/or the memory bank 232-7.

Each of the memory banks 232 has a physical address and a logical address. Specifically, the memory bank 232-0 has physical address "PA 0" and logical address "LA 0." The memory bank 232-1 has physical address "PA 1" and logical address "LA 1." The memory bank 232-2 has physical address "PA 2" and logical address "LA 2." The memory bank 232-3 has physical address "PA 3" and logical address "LA 3." The memory bank 232-4 has physical address "PA 4" and logical address "LA 4." The memory bank 232-5 has physical address "PA 5" and logical address "LA 5." The memory bank 232-6 has physical address "PA 6" and logical address "LA 6." The memory bank 232-7 has physical address "PA 7" and logical address "LA 7." The example illustrated in FIG. 2A represents default logical to physical addressing.

Figure 2B:
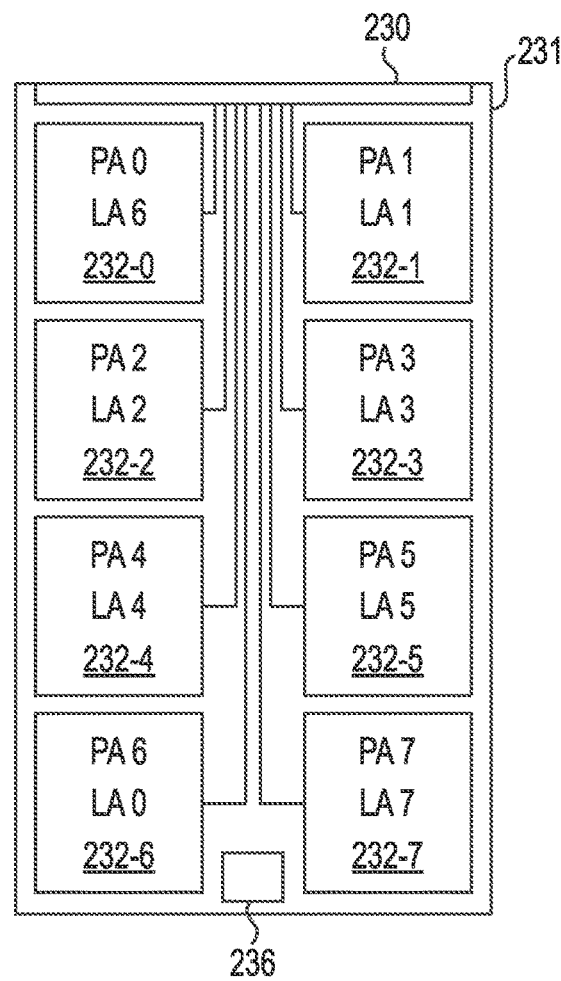
FIG. 2B is a block diagram of a memory die, including a temperature sensor and memory banks, having remapped logical to physical addressing according to the present disclosure.

FIG. 2B is a block diagram of a memory die 231, including a temperature sensor 236 and memory banks 232, having remapped logical to physical addressing according to the present disclosure. The memory die 231, memory banks 232, bus 230, and temperature sensor 236 are analogous to those described in association with FIG. 2A, except that at least one logical address has been remapped.

Address circuitry (not illustrated by FIG. 2B), such as the address circuitry 108 described in association with FIG. 1, can receive signaling from the temperature sensor 236 indicative of a sensed temperature. In response to the temperature sensor 236 detecting an excessive sensed temperature, logical addresses of one or more memory banks of the memory die 231 can be remapped to different memory banks of the memory die 231. For example, as illustrated by FIG. 2B, in response to the temperature sensor 236 detecting an excessive sensed temperature, logical address "LA 6" can be remapped from the memory bank 232-6 to the memory bank 232-0. The address circuitry can cause the remapping to occur. Thus, logical address "LA 6" that was previously mapped to the memory bank 232-6 has been remapped to the memory bank 232-0 such that the memory bank 232-0 has physical address "PA 0" and remapped logical address "LA 6."

As illustrated by FIG. 2B, in response to remapping logical address "LA 6" to the memory bank 232-0, logical address "LA 0" can be remapped from the memory bank 232-0 to the memory bank 232-6. Thus, the memory bank 232-6 has physical address "PA 6" and remapped logical address "LA 0." The remainder of the logical to physical mappings for the memory banks 232-1, 232-2, 232-3, 232-4, 232-5, and 232-7 remain in the default state as described in association with FIG. 2A.

Embodiments of the present disclosure are not limiting to swapping mapping of logical addresses as illustrated by FIG. 2B. For example, in some embodiments, the connection of the bus 230 to the memory bank 232-6 can be permanently severed in response to the temperature sensor 236 detecting an excessive sensed temperature. Each respective line of the bus 230 coupled to the memory banks 232 can include a fuse that can be blown to sever a connection to a particular memory bank. The address circuitry can be configured to activate the respective fuse associated with a particular memory bank having a particular physical address to remap it from an originally mapped logical address to a different logical address, as described herein.

Figures 2C, 2D:
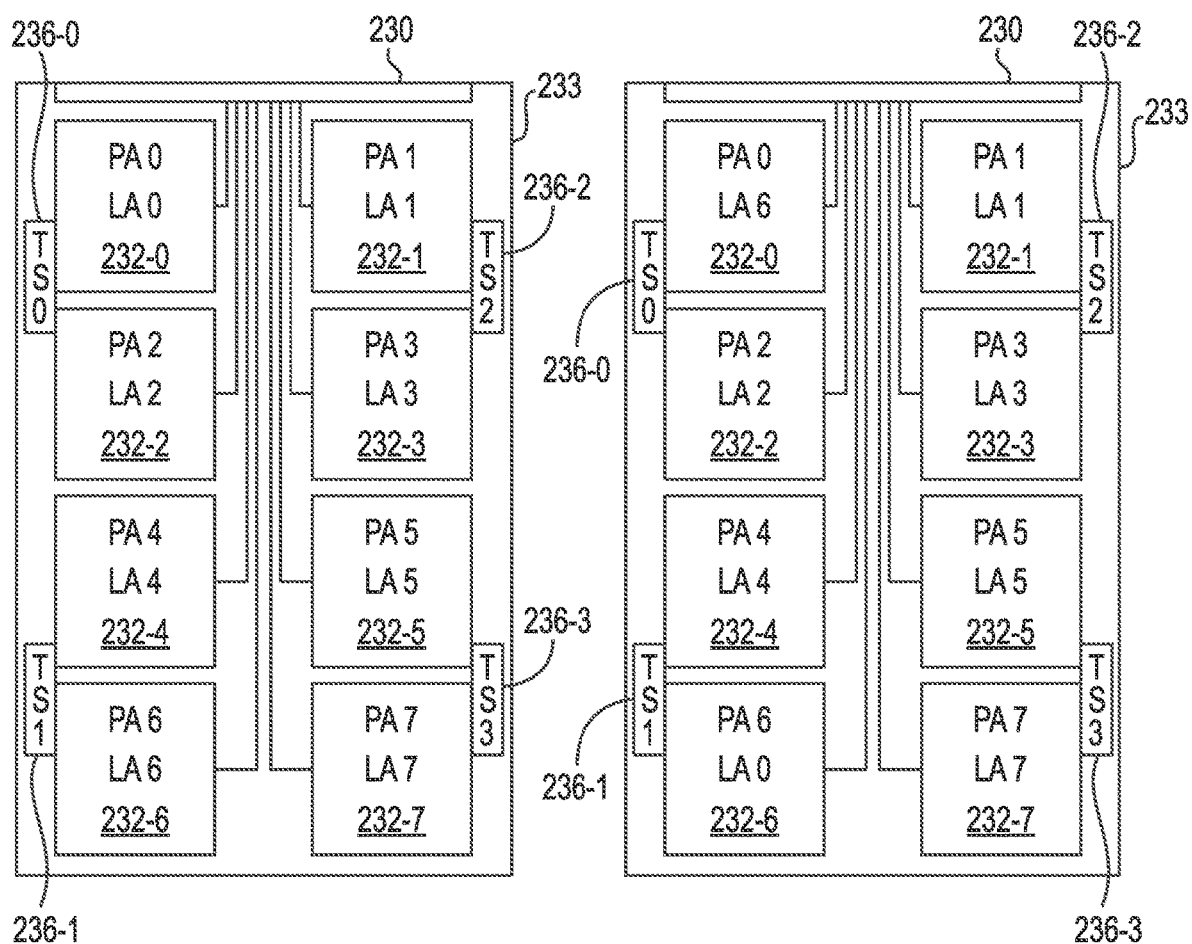
FIG. 2C is a block diagram of a memory die, including multiple temperature sensors and memory banks, having default logical to physical addressing according to the present disclosure.
FIG. 2D is a block diagram of a memory die, including multiple temperature sensors and memory banks, having remapped logical to physical addressing according to the present disclosure.

FIG. 2C is a block diagram of a memory die 233, including multiple temperature sensors "TS 0" 236-0, "TS 1" 236-1, "TS 2" 236-2, and "TS 3" 236-3 (collectively referred to as the temperature sensors 236) and memory banks 232, having default logical to physical addressing according to the present disclosure. The memory banks 232, bus 230, and temperature sensors 236 are analogous to those described in association with FIG. 2A. The block diagram of the memory die 233 illustrated by FIG. 2C is representative and illustrative of a memory die, but is not intended to imply or limit a shape or size of the memory die, or components thereof.

The memory die 233 illustrated by FIG. 2C differs from the memory die 231 illustrated by FIG. 2A in that four temperature sensors 236 are disposed on the memory die 233. The additional temperature sensors 236 (relative to the memory die 231) provide increased resolution in determining and/or identifying which of the memory banks 232 of the memory die 233 are experiencing excessive operating temperatures as indicated by the sensed temperatures detected by the temperature sensors 236.

The temperature sensors 236 of the memory die 233 can correspond to different regions and/or components of the memory die 233. For example, sensed temperatures detected by the temperature sensor "TS 0" 236-0 can correspond to an upper left region (as illustrated by FIG. 2C) and/or the memory banks 232-0 and 232-2 of the memory die 233, and operating temperatures thereof. Sensed temperatures detected by the temperature sensor "TS 1" 236-1 can correspond to a bottom left region (as illustrated by FIG. 2C) and/or the memory banks 232-4 and 232-6 of the memory die 233, and operating temperatures thereof. Sensed temperatures detected by the temperature sensor "TS 2" 236-2 can correspond to an upper right region (as illustrated by FIG. 2C) and/or the memory banks 232-1 and 232-3 of the memory die 233, and operating temperatures thereof. Sensed temperatures detected by the temperature sensor "TS 3" 236-3 can correspond to a bottom right region (as illustrated by FIG. 2C) and/or the memory banks 232-5 and 232-7 of the memory die 233, and operating temperatures thereof.

FIG. 2D is a block diagram of a memory die 233, including multiple temperature sensors 236 and memory banks 232, having remapped logical to physical addressing according to the present disclosure. The memory die 233, memory banks 232, bus 230, and temperature sensors 236 are analogous to those described in association with FIG. 2C, except that at least one logical address has been remapped.

Address circuitry (not illustrated by FIG. 2D), such as the address circuitry 108 described in association with FIG. 1, can receive signaling from the temperature sensors 236 indicative of sensed temperatures. In response to one or more of the temperature sensors 236 detecting an excessive sensed temperature, logical address of corresponding memory banks of the memory die 233 can be remapped to different memory banks of the memory die 233. For example, as illustrated by FIG. 2D, in response to the temperature sensor "TS 1" 236-1 detecting an excessive sensed temperature, logical address "LA 6" can be remapped from the memory bank 232-6 to the memory bank 232-0.

The excessive sensed temperature detected by the temperature sensor "TS 1" 236-1 can be indicative of an excessive operating temperature of the memory bank 232-6 and/or the memory bank 232-4. The address circuitry can cause the remapping to occur. Thus, logical address "LA 6" that was previously mapped to the memory bank 232-6 has been remapped to the memory bank 232-0 such that the memory bank 232-0 has physical address "PA 0" and remapped logical address "LA 6."

As illustrated by FIG. 2D, in response to remapping logical address "LA 6" to the memory bank 232-0, logical address "LA 0" can be remapped from the memory bank 232-0 to the memory bank 232-6. Thus, the memory bank 232-6 has physical address "PA 6" and remapped logical address "LA 0." The remainder of the logical to physical mappings for the memory banks 232-1, 232-2, 232-3, 232-4, 232-5, and 232-7 remain in the default state as described in association with FIG. 2C.

Remapping the logical address "LA 6" to the memory bank 232-0 can be based on the temperature sensor "TS 0" 236-0 not detecting an excessive sensing temperature. Remapping the logical address "LA 6" to the memory bank 232-0 can be based on a write rate to and/or a read rate from the memory bank 232-0 being below respective threshold rates. Write rates to and/or read rates from a memory bank (e.g., the memory bank 232-0) can be indicative of operating temperatures of that memory bank.

Although not illustrated by FIG. 2D, in addition or in alternative to remapping the logical address "LA 6" from the memory bank 232-6 to the memory bank 232-0 in response to the temperature sensor "TS 1" 236-1 detecting an excessive sensed temperature, logical address "LA 4" can be remapped from the memory bank 232-4 to the memory bank 232-1, for example. Logical address "LA 4" that was previously mapped to the memory bank 232-4 can been remapped to the memory bank 232-1 such that the memory bank 232-1 has physical address "PA 1" and remapped logical address "LA 4."

In some embodiments, remapping logical addresses of multiple memory banks corresponding to one or more temperature sensors detecting excessive sensed temperatures can be prioritized such logical addresses of one memory bank are remapped prior to or in alternative to remapping logical addresses of another memory bank. Prioritization of remapping can occur to remap logical addresses of the "hottest" memory bank first. Prioritization of remapping can occur when there are insufficient memory banks of a memory die to which logical addresses are to be remapped. Prioritization of remapping can be based on write rates to and/or read rates from memory banks (e.g., the memory banks 232-4 and 232-6). Logical addresses of a memory bank corresponding to a temperature sensor detecting an excessive sensed temperature having the greatest write rate and/or read rate can be remapped first. Prioritization of remapping can be based on magnitudes of sensed temperatures and/or differences between magnitudes of sensed temperatures.

Figure 2E:
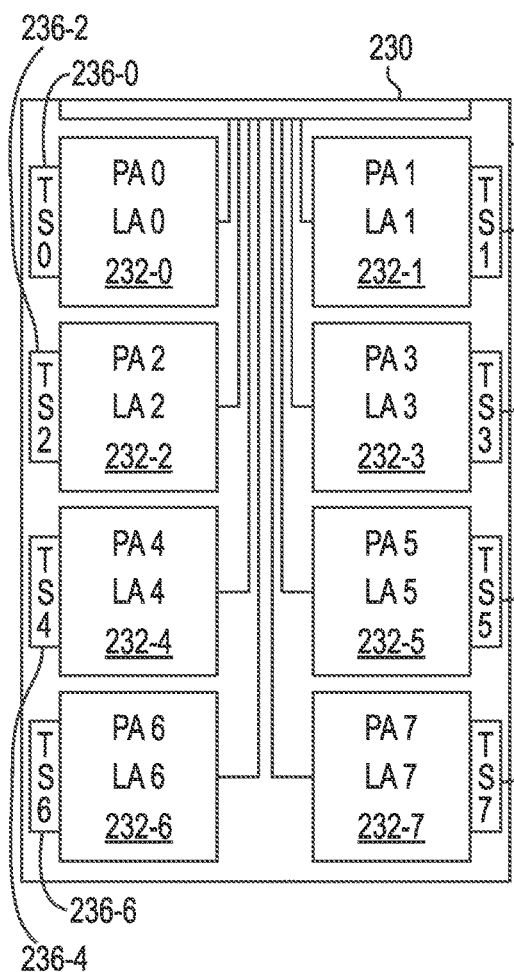
FIG. 2E is a block diagram of a memory die, including respective temperature sensors corresponding to each of the memory banks, having default logical to physical addressing according to the present disclosure.

FIG. 2E is a block diagram of a memory die 233, including respective temperature sensors "TS 0" 236-0, "TS 1" 236-1, "TS 2" 236-2, "TS 3" 236-3, "TS 4" 236-4, "TS5" 236-5, "TS 6" 236-6, and "TS 7" 236-7 (collectively referred to as the temperature sensors 236) corresponding to each of the memory banks 232 having default logical to physical addressing according to the present disclosure. The memory banks 232, bus 230, and temperature sensors 236 are analogous to those described in association with FIG. 2C. The block diagram of the memory die 233 illustrated by FIG. 2E is representative and illustrative of a memory die, but is not intended to imply or limit a shape or size of the memory die, or components thereof.

The memory die 233 illustrated by FIG. 2E differs from the memory die 233 illustrated by FIG. 2C in that eight temperature sensors 236 are disposed on the memory die 233. The additional temperature sensors 236 (relative to the memory die 233) provide further increased resolution in determining and/or identifying which of the memory banks 232 of the memory die 233 are experiencing excessive operating temperatures as indicated by the sensed temperatures detected by the temperature sensors 236.

The temperature sensors 236 of the memory die 233 can correspond to different regions and/or components of the memory die 233. For example, sensed temperatures detected by the temperature sensor "TS 0" 236-0 can correspond to the memory bank 232-0 and/or surrounding region of the memory die 233, and operating temperatures thereof. Sensed temperatures detected by the temperature sensor "TS 1" 236-1 can correspond to the memory bank 232-1 and/or surrounding region of the memory die 233, and operating temperatures thereof. Sensed temperatures detected by the temperature sensor "TS 2" 236-2 can correspond to the memory bank 232-2 and/or surrounding region of the memory die 233, and operating temperatures thereof. Sensed temperatures detected by the temperature sensor "TS 3" 236-3 can correspond to the memory bank 232-3 and/or surrounding region of the memory die 233, and operating temperatures thereof. Sensed temperatures detected by the temperature sensor "TS 4" 236-4 can correspond to the memory bank 232-4 and/or surrounding region of the memory die 233, and operating temperatures thereof. Sensed temperatures detected by the temperature sensor "TS 5" 236-5 can correspond to the memory bank 232-5 and/or surrounding region of the memory die 233, and operating temperatures thereof. Sensed temperatures detected by the temperature sensor "TS 6" 236-6 can correspond to the memory bank 232-6 and/or surrounding region of the memory die 233, and operating temperatures thereof. Sensed temperatures detected by the temperature sensor "TS 7" 236-7 can correspond to the memory bank 232-7 and/or surrounding region of the memory die 233, and operating temperatures thereof.

Figure 2F:
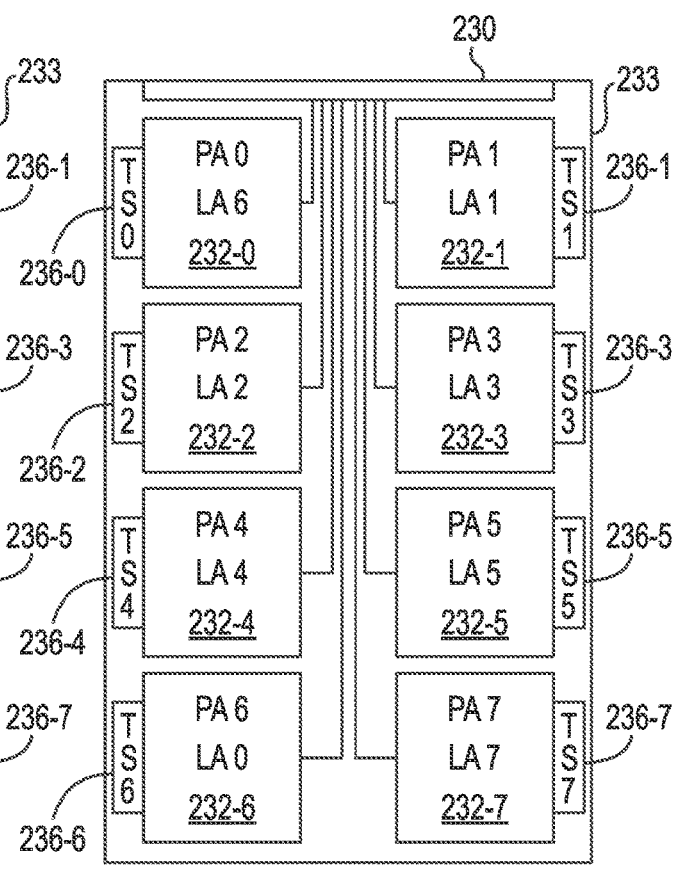
FIG. 2F is a block diagram of a memory die, including respective temperature sensors corresponding to each of the memory banks, having remapped logical to physical addressing according to the present disclosure.

FIG. 2F is a block diagram of a memory die 233, including respective temperature sensors 236 corresponding to each of the memory banks 232, having remapped logical to physical addressing according to the present disclosure. The memory die 233, memory banks 232, bus 230, and temperature sensors 236 are analogous to those described in association with FIG. 2E, except that at least one logical address has been remapped.

Address circuitry (not illustrated by FIG. 2F), such as the address circuitry 108 described in association with FIG. 1, can receive signaling from the temperature sensors 236 indicative of sensed temperatures. In response to one or more of the temperature sensors 236 detecting an excessive sensed temperature, logical address of corresponding memory banks of the memory die 233 can be remapped to different memory banks of the memory die 233. For example, as illustrated by FIG. 2F, in response to the temperature sensor "TS 6" 236-6 detecting an excessive sensed temperature, logical address "LA 6" can be remapped from the memory bank 232-6 to the memory bank 232-0. The excessive sensed temperature detected by the temperature sensor "TS 6" 236-6 can be indicative of an excessive operating temperature of the memory bank 232-6 and/or the memory bank 232-4. The address circuitry can cause the remapping to occur. Thus, logical address "LA 6" that was previously mapped to the memory bank 232-6 has been remapped to the memory bank 232-0 such that the memory bank 232-0 has physical address "PA 0" and remapped logical address "LA 6."

As illustrated by FIG. 2F, in response to remapping logical address "LA 6" to the memory bank 232-0, logical address "LA 0" can be remapped from the memory bank 232-0 to the memory bank 232-6. Thus, the memory bank 232-6 has physical address "PA 6" and remapped logical address "LA 0." The remainder of the logical to physical mappings for the memory banks 232-1, 232-2, 232-3, 232-4, 232-5, and 232-7 remain in the default state as described in association with FIG. 2E. Remapping the logical address "LA 6" to the memory bank 232-0 can be based on the temperature sensor "TS 0" 236-0 not detecting an excessive sensing temperature. Remapping the logical address "LA 6" to the memory bank 232-0 can be based on a write rate to and/or a read rate from the memory bank 232-0 being below respective threshold rates.

Figure 3:
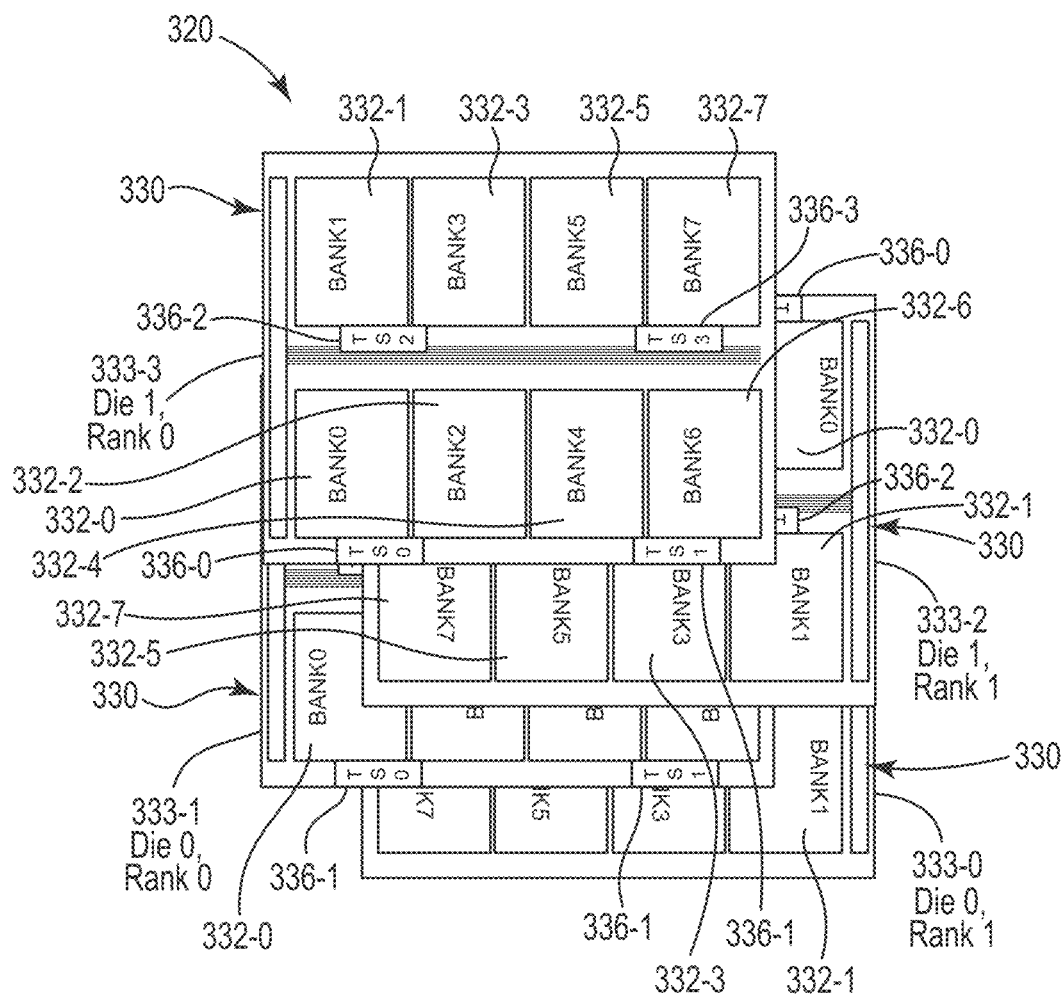
FIG. 3 is an exploded view of a stack of memory dies including multiple temperature sensors according to the present disclosure.

FIG. 3 is an exploded view of a stack 320 of memory dies 333-1, 333-2, 333-3, and 333-4 (collectively referred to as the memory dies 333) including multiple temperature sensors 336-0, 336-1, 336-2, and 336-3 (collectively referred to as the temperature sensors 336) according to the present disclosure. The stack 320 of the memory dies 333 can be analogous to the memory array 120 described in association with FIG. 1. Each of the memory dies 333-1, 333-2, 333-3, and 333-4 and the bus 330 can be analogous to the memory die 233 and the bus 230, respectively, described in association with FIGS. 2C-2D. The block diagram illustrated by FIG. 3 is representative and illustrative of a stack of memory dies, but is not intended to imply or limit a shape or size of the stack of memory dies, or components thereof.

The stack 320 is illustrated having four of the memory die 333; however, embodiments of the present disclosure are not so limited. For example, the stack 320 can include fewer than four memory dies (e.g., two memory dies) or greater than four memory dies (e.g., twelve memory dies). As described in association with FIGS. 2C-2D, each of the memory dies 333 include respective four temperature sensor "TS 0" 336-0, "TS 1" 336-1, "TS 2" 336-2, and "TS 3" 336-3. Thus, the stack 320 includes sixteen of the temperature sensors 336. Although FIG. 3 illustrates each memory die 333 having four temperature sensors 336 disposed on the memory dies at the same positions, embodiments are not so limited. In some embodiments, at least one memory die of the stack 320 can include fewer temperature sensors (e.g., the memory die 231) or greater temperature sensors (e.g., the memory die 233). In some embodiments, at least one memory die of the stack 320 can include at least one temperature sensor disposed at a different position than another memory die of the stack 320.

As illustrated by FIG. 3, the memory dies 333 can correspond to ranks of the stack 320. For example, the memory die 333-0 can correspond to die 0, rank 1 of the stack 320. The memory die 333-1 can correspond to die 0, rank 0 of the stack 320. The memory die 333-2 can correspond to die 1, rank 1 of the stack 320. The memory die 333-3 can correspond to die 1, rank 0 of the stack 320. Although FIG. 3 illustrates the four memory dies 333 as individual components of the stack 320, in some embodiments the memory dies 333-0 and 333-1 can correspond to respective physical sides of a memory module (die 0) where rank 1 corresponds to one physical side of the memory module and rank 0 corresponds to the other physical side of the memory module. Similarly, in some embodiments the memory dies 333-2 and 333-3 can correspond to respective physical sides of a memory module (die 1) where rank 1 corresponds to one physical side of the memory module and rank 0 corresponds to the other physical side of the memory module. The two memory modules (die 0 and die 1) can together form the stack 320. In some embodiments, remapping logical address of the memory banks 332 can be based on the rank of the memory die on which an excessive sensed temperature is detected.

Figure 4A:
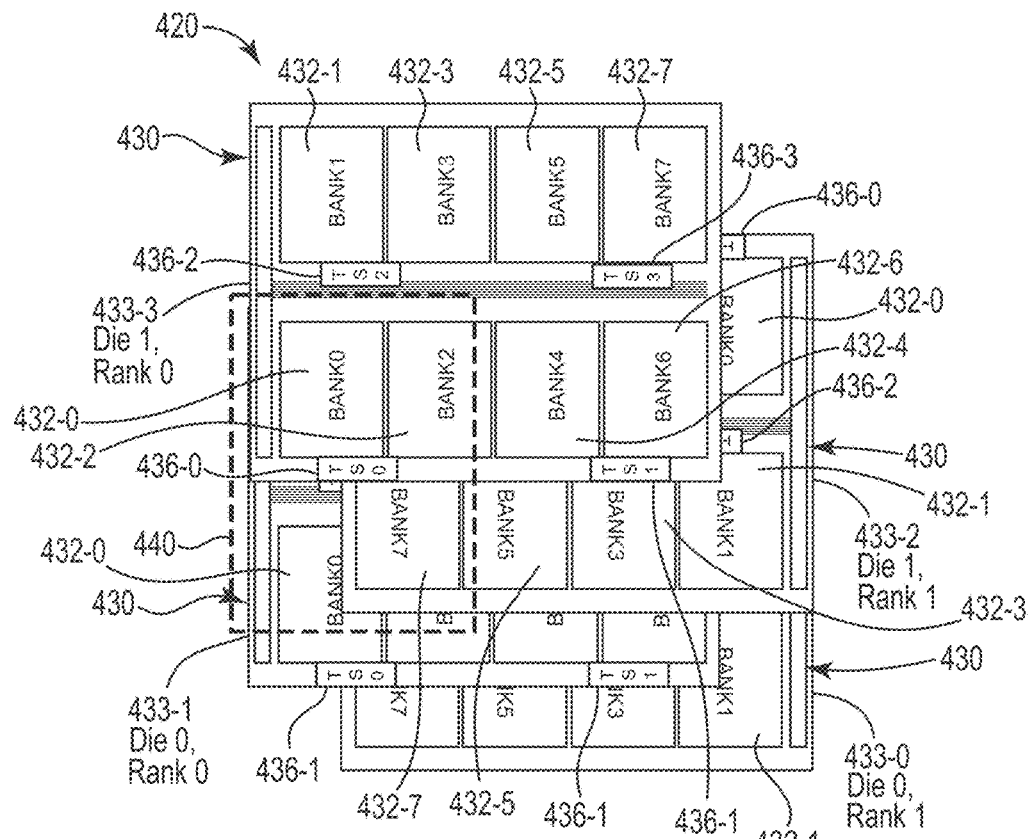
FIG. 4A is an exploded view of a stack of memory dies, including multiple temperature sensors and memory banks, having default logical to physical addressing according to the present disclosure.

FIG. 4A is an exploded view of a stack 420 of memory dies 433-0, 433-1, 433-2, and 433-3 (collectively referred to as the memory dies 433) including multiple temperature sensors "TS 0" 436-0, "TS 1" 436-1, "TS 2" 436-2, and "TS 3" 436-3 (collectively referred to as the temperature sensors 436) and memory banks 432 having remapped memory banks having default logical to physical addressing according to the present disclosure. The stack 420 of the memory dies 433 can be analogous to the stack 320 described in association with FIG. 3. Each of the memory dies 433-1, 433-2, 433-3, and 433-4 can be analogous to the memory dies 233 described in association with FIGS. 2C-2F. The block diagram illustrated by FIG. 4A is representative and illustrative of a stack of memory dies, but is not intended to imply or limit a shape or size of the stack of memory dies, or components thereof.

As illustrated by FIG. 4A, because of the arrangement of the temperature sensors 436 on each respective memory die 433 (the respective positions of the temperature sensors 436 on the memory dies 433), the temperature sensors 436 are in a staggered arrangement within the stack 420. In other words, the temperature sensors 436 are not vertically adjacent through the stack 420. Such a staggered arrangement provides a capability to monitor operating temperatures (via sensed temperatures) throughout the stack 420 specific portions or regions of the stack 420 that are experiencing excessive operating temperatures.

FIG. 4A illustrates a "hot spot" of the stack 420 via the dashed box 440. One or more components of the stack 420 within the box 440 are experiencing an excessive operating temperature. Although the "hot spot" is denoted by the two-dimensional box 440, the "hot spot" is three-dimensional. The box 440 can represent a threshold number of physical addresses, memory cells, rows of memory cells, and/or columns of memory cells away from a physical address, memory cell, row of memory cells, and/or column of memory cells experiencing an excessive operating temperature. As illustrated by FIG. 4A, the "hot spot" is in the bottom left corner of the stack 420. As delineated by the box 440, the temperature sensor "TS 0" 436-0 and the memory banks "BANK0" 432-0 and "BANK2" 432-2 of the memory die 433-3 and the temperature sensor "TS 3" 436-3 and the memory banks "BANK5" 432-5 and "BANK7" 432-7 of the memory die 433-2 are within the "hot spot."

Figure 4B:
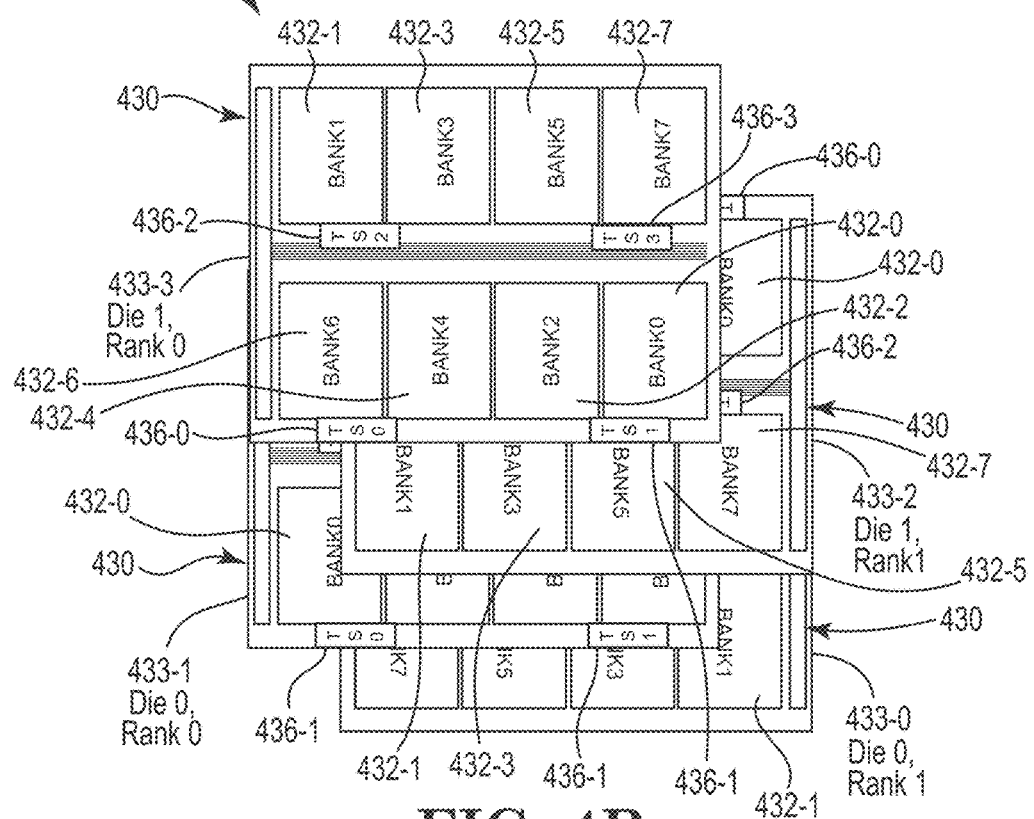
FIG. 4B is an exploded view of a stack of memory dies, including multiple temperature sensors and memory banks, having remapped logical to physical addressing according to the present disclosure.

FIG. 4B is an exploded view of a stack 420 of memory dies 433 including multiple temperature sensors 436 and memory banks 432 having remapped logical to physical addressing according to the present disclosure. The memory die 433, memory banks 432, bus 430, and temperature sensors 436 are analogous to those described in association with FIG. 4A, except logical addresses has been remapped.

In response to the temperature sensor "TS 0" 436-0 of the memory die 433-3 and/or the temperature sensor "TS 3" 436-3 of the memory die 433-2 detecting an excessive sensed temperature, logical addresses of the memory banks "BANK0" 432-0 and "BANK2" 432-2 of the memory die 433-3 and the memory banks "BANK5" 432-5 and "BANK7" 432-7 of the memory die 433-2 can be remapped to other memory banks of the respective memory dies. As illustrated by FIG. 4B relative to FIG. 4A, logical addresses of "BANK0" and "BANK2" of the memory die 433-3 are remapped from the memory banks 432-0 and 432-2 of the memory die 433-3, respectively, to the memory banks 432-6 and 432-4, respectively, of the memory die 433-3. Logical addresses of "BANK5" and "BANK7" of the memory die 433-2 are remapped from the memory banks 432-5 and 432-7 of the memory die 433-2, respectively, to the memory banks 432-3 and 432-1, respectively, of the memory die 433-2.

As illustrated by FIG. 4B, in response to remapping the logical addresses of "BANK0" and "BANK2" to the memory banks 432-6 and 432-4 of the memory die 433-3, respectively, logical addresses of "BANK6" and "BANK4" of the memory die 433-3 can be remapped from the memory banks 432-6 and 432-4 of the memory die 433-3, respectively, to the memory banks 432-0 and 432-2 of the memory die 433-3, respectively. In response to remapping the logical addresses of "BANK5" and "BANK7" to the memory banks 432-1 and 432-3 of the memory die 432-2, respectively, logical addresses of "BANK1" and "BANK3" of the memory die 433-2 can be remapped from the memory banks 432-1 and 432-3 of the memory die 433-2, respectively, to the memory banks 432-7 and 432-5 of the memory die 433-2, respectively. The remainder of the logical to physical mappings for the stack 420 remain in the default state as described in association with FIG. 4A.

In some embodiments, logical addresses of all memory banks 432 of a memory die of a stack can be remapped to memory banks of another memory die of the stack. For example, instead of remapping logical addresses of "BANK0" and "BANK2" of the memory die 433-3 to other memory banks of the same memory die, the memory die 433-3, logical addresses of all memory banks 432 of the memory die 433-3 can be remapped to memory banks of another memory die of the stack 420, such as the memory die 433-0 or the memory die 433-1. Such a large-scale remapping can be achieved by modifying the control signals.

Figure 5:
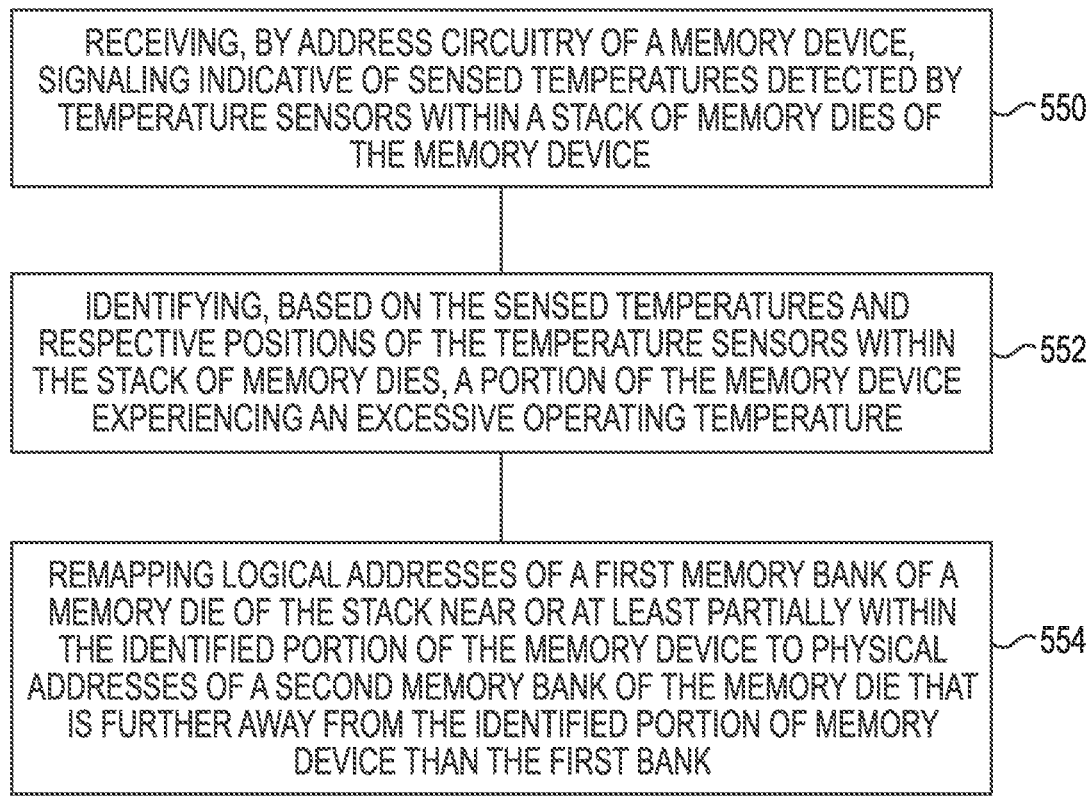
FIG. 5 is a flow diagram illustrating a method for memory bank remapping based on sensed temperatures according to the present disclosure.

FIG. 5 is a flow diagram illustrating a method for memory bank remapping based on sensed temperatures according to the present disclosure. The method described in FIG. 5 can be performed by, for example, a memory device, such as the memory device 104 described in association with FIG. 1.

At block 550, the method can include receiving, by address circuitry of a memory device, signaling indicative of sensed temperatures detected by a plurality of temperature sensors within a stack of memory dies of the memory device.

At block 552, the method can include identifying, based on the sensed temperatures and respective positions of the plurality of temperature sensors within the stack of memory dies, a portion of the memory device experiencing an excessive operating temperature. Identifying the portion of the memory device can include identifying which of the plurality of temperature sensors are detecting an excessive sensed temperatures. The method can include receiving a user-defined threshold sensed temperature and identifying which of the plurality of temperature sensors are detecting sensed temperatures exceeding the user-defined threshold sensed temperature.

At block 554, the method can include remapping logical addresses of a first memory bank of a memory die of the stack of memory dies near or at least partially within the identified portion of the memory device to physical addresses of a second memory bank of the memory die that is further away from the identified portion of the memory device than the first memory bank. In at least one embodiment, remapping logical address as described herein can occur in response to another criterion being satisfied in addition to a memory device experiencing an excessive operating temperature. For example, the method can include determining a respective frequency of access for the first and second memory bank. Remapping the logical addresses of the first memory bank to the physical addresses of the second memory bank can occur in response to the frequency of access of the second memory bank being less than the frequency of access of the first memory bank. A high frequency of access of a memory bank can be indicative of streaming video, for example, which can cause operating temperatures of a memory device to rise.

Power consumption and/or resource consumption can be reduced in some embodiments by activating and inactivating temperature sensors of a memory die based on frequencies of access of memory banks of that memory die. If memory banks of a memory die are accessed infrequently, then one or more temperature sensors of that memory die can be put in an inactive state or an active state. As used herein, an "inactive state" of a temperature sensor refers to a state in which the temperature sensor is not fully functional. Putting a temperature sensor in an inactive state can include reducing power provided to the temperature sensor such that the temperature sensor is not fully functional. As used herein, an "active state" of a temperature sensor refers to a state in which the temperature sensor is fully functional. Putting a temperature sensor in an active state can include providing power to the temperature sensor such that the temperature sensor is fully functional.

Although not specifically illustrated in FIG. 4, in at least one embodiment, the method can include blowing a fuse of an address path to the first memory bank. The method can include identifying, based on the sensed temperatures and the respective positions of the plurality of temperature sensors within the stack of memory dies, another portion of the memory device experiencing an excessive operating temperature. Logical addresses of a third memory bank on a different memory die of the stack of memory dies near or at least partially within the identified other portion of the memory device can be remapped to physical addresses of a fourth memory bank of the different memory die that is further away from the identified other portion of the memory device than the third memory bank.

In at least one embodiment, remapping logical address as described herein can occur in response to another criterion being satisfied in addition to a memory device experiencing an excessive operating temperature. For example, the method can include determining a write rate to or a read rate from the first or second memory bank and determining whether to remap the logical addresses of the first memory bank to the physical addresses of the second memory bank based at least in part on the write rate or the read rate. An increased read rate and/or write rate can be indicative of streaming video, for example, which can cause operating temperatures of a memory device to rise. Remapping the logical addresses of the first memory bank can include remapping the logical addresses of the first memory bank to the physical addresses of the second memory bank in response to the write rate or the read rate being at least a threshold write rate or a threshold read rate, respectively. Responsive to the write rate or the read rate being less than the threshold write rate or the threshold read rate, respectively, at least one of the temperature sensors can be maintained in an inactive state. As used herein, an "inactive state" of a temperature sensor refers to a state in which the temperature sensor is not fully functional. Maintaining a temperature sensor in an inactive state can include reducing power provided to the temperature sensor such that the temperature sensor is not fully functional. Responsive to the write rate or the read rate being at least the threshold write rate or the threshold read rate, respectively, at least one of the temperature sensors can be maintained in an active state. As used herein, an "active state" of a temperature sensor refers to a state in which the temperature sensor is fully functional. Maintaining a temperature sensor in an active state can include providing power to the temperature sensor such that the temperature sensor is fully functional.

Embodiments can include a tangible machine-readable storage medium (also known as a computer-readable medium) on which is stored one or more sets of instructions or software embodying any one or more of the methodologies or functions described herein. In some embodiments, a memory device or a processing device constitutes a machine-readable medium. The term "machine-readable storage medium" includes a single medium or multiple media that store the one or more sets of instructions. The term "machine-readable storage medium" includes any medium that is capable of storing or encoding a set of instructions for execution by the machine and that cause the machine to perform any one or more of the methodologies of the present disclosure. The term "machine-readable storage medium" includes, but is not limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising;
   receiving, by an address circuitry of a memory device, signaling indicative of first sensed temperatures detected by a first plurality of temperature sensors directly connected to a first memory die within a stack of memory dies;
   wherein the first plurality of temperature sensors are each in a different physical location on the first memory die;

receiving, by the address circuitry of the memory device, signaling indicative of second sensed temperatures detected by a second plurality of temperature sensors directly connected to a second memory die within the stack of memory dies;

wherein the second plurality of temperature sensors are each in a different physical location on the second memory die;

receiving, by the address circuitry of the memory device, signaling indicative of third sensed temperatures detected by a third plurality of temperature sensors directly connected to a third memory die within the stack of memory dies, wherein the third plurality of temperature sensors are each in a different physical location on the third memory die;

wherein respective temperature sensors of the first plurality of temperature sensors and respective temperature sensors of the third plurality of temperature sensors are physically vertically aligned in respective three-dimensional cross-sections of the stack of memory dies, and wherein the second plurality of temperature sensors are in staggered arrangement within the stack of memory dies versus the first plurality of temperature sensors and the third plurality of temperature sensors, such that the second plurality of temperature sensors are outside of the respective three-dimensional cross-sections of the stack of memory dies;

identifying, based at least in part on the first, second, and third sensed temperatures and respective positions of the first, second, and third plurality of temperature sensors within the stack of memory dies, a portion of the memory device experiencing an excessive operating temperature; and remapping logical addresses of a first memory bank of the first memory die within a threshold number of physical addresses of the identified portion of the memory device to physical addresses of a second memory bank of the first memory die that is further away from the identified portion of memory device than the first memory bank.

2. The method of claim 1, wherein identifying the portion of the memory device comprises identifying which of the first, second, and third plurality of temperature sensors are detecting the excessive sensed temperature.

3. The method of claim 2, wherein identifying which of the first, second, and third plurality of temperature sensors are detecting the excessive sensed temperature comprises:
receiving a user-defined threshold sensed temperature; and
identifying which of the first, second, and third plurality of temperature sensors are detecting sensed temperatures exceeding the user-defined threshold sensed temperature.

4. The method of claim 1, further comprising blowing a fuse of an address path to the first memory bank.

5. The method of claim 1, further comprising:
identifying, based at least in part on the first, second, and third sensed temperatures and respective positions of the first, second, and third plurality of temperature sensors within the stack of memory dies, another portion of the memory device experiencing an excessive operating temperature; and
remapping logical addresses of a third memory bank of the second memory die near or at least partially within the identified other portion of the memory device to physical ad dresses of a fourth memory bank of the second memory die that is further away from the identified other portion of the memory device than the third memory bank.

6. The method of claim 1, wherein remapping the logical addresses of the first memory bank further comprises:
determining a first frequency of access of the first memory bank;
determining a second frequency of access of the first memory bank of the second memory bank; and
remapping the logical addresses of the first memory bank to the physical addresses of the second memory bank in response to the second frequency of access being less than the first frequency of access.

7. An apparatus, comprising:
a stack of memory dies including:
a first memory die directly connected to a first plurality of temperature sensors, wherein the first plurality of temperature sensors are each in a different physical location on the first memory die;
a second memory die directly connected to a second plurality of temperature sensors, wherein the second plurality of temperature sensors are each in a different physical location on the second memory die;
a third memory die directly connected to a third plurality of temperature sensors, wherein the third plurality of temperature sensors are each in a different physical location on the third memory die,
wherein respective temperature sensors of the first plurality of temperature sensors and respective temperature sensors of the third plurality of temperature sensors are physically vertically aligned in respective three-dimensional cross-sections of the stack of memory dies, and
wherein the second plurality of temperature sensors are in staggered arrangement within the stack of memory dies versus the first plurality of temperature sensors and the third plurality of temperature sensors, such that the second plurality of temperature sensors are outside of the respective three-dimensional cross-sections of the stack of memory dies; and
address circuitry coupled to the first, second, and third plurality of temperature sensors and configured to:
identify, based at least in part on the first, second, and third sensed temperatures and respective positions of the first, second, and third plurality of temperature sensors within the stack of memory dies, a portion of the memory device experiencing an excessive operating temperature; and
remap logical addresses of a first memory bank of the second memory die within a threshold number of physical addresses of the identified portion of the memory device to physical addresses of a second memory bank of the second memory die that is further away from the identified portion of memory device than the first memory bank.

8. The apparatus of claim 7, wherein the excessive sensed temperature is a temperature differential of at least a particular magnitude between a first sensed temperature and a second sensed temperature detected by the first plurality of temperature sensors, or a third sensed temperature and a fourth sensed temperature detected by the second plurality of temperature sensors.

9. The apparatus of claim 7, wherein the address circuitry is further configured to remap the logical addresses of the first memory bank to the second memory bank in response to at least one of the second plurality of temperature sensors not detecting an excessive sensed temperature.

10. The apparatus of claim 7, wherein the address circuitry is further configured to remap the logical addresses of the first memory bank to the second memory bank in response to a first one of the second plurality of temperature sensors detecting a first sensed temperature that is at least a particular quantity of degrees less than a second sensed temperature detected by a second one of the second plurality of temperature sensors.

11. The apparatus of claim 7, wherein the address circuitry is further configured to cause an address path to the second memory bank to be permanently severed in response to the excessive operating temperature.

12. The apparatus of claim 7, wherein the address circuitry is further configured to, responsive to a particular one of the second plurality of temperature sensors detecting a decrease of a sensed temperature of at least a particular quantity of degrees, remap the logical addresses to the first memory bank.

13. An apparatus, comprising:
a stack of memory dies including:
    a first memory die directly connected to a first plurality of temperature sensors, wherein the first plurality of temperature sensors are each in a different physical location on the first memory die;
    a second memory die directly connected to a second plurality of temperature sensors, wherein the second plurality of temperature sensors are each in a different physical location on the second memory die;
    a third memory die directly connected to a third plurality of temperature sensors, wherein the third plurality of temperature sensors are each in a different physical location on the third memory die,
    wherein respective temperature sensors of the first plurality of temperature sensors and respective temperature sensors of the third plurality of temperature sensors are physically vertically aligned in respective three-dimensional cross-sections of the stack of memory dies, and
    wherein the second plurality of temperature sensors are in staggered arrangement within the stack of memory dies versus the first plurality of temperature sensors and the third plurality of temperature sensors, such that the second plurality of temperature sensors are outside of the respective three-dimensional cross-sections of the stack of memory dies; and
address circuitry coupled to the stack of memory dies and configured to:
    receive, from the first, second, and third plurality of temperature sensors, signaling indicative of sensed temperatures within the stack of memory dies;
    determine, for each respective memory die of the stack of memory dies and based at least in part on the signaling, whether a first sensed temperature detected by a first temperature sensor disposed on the respective memory die differs from a second sensed temperature detected by a second temperature sensor disposed on the respective memory die by at least a particular quantity of degrees;
    responsive to the determining for each respective memory die of the stack of memory dies that the first sensed temperature differs from the second sensed temperature by at least the particular quantity of degrees, identify, based at least in part on the signaling and positions of the temperature sensors on the respective memory die, a memory bank near the first temperature sensor; and
    remap logical addresses of the identified memory bank to a non-identified memory bank of the respective memory die.

14. The apparatus of claim 13, wherein each respective memory die of the stack of memory dies comprises a temperature sensor associated with and adjacent to each respective memory bank of the respective memory die.

15. The apparatus of claim 13, wherein the non-identified memory bank of the respective memory die includes physical addresses that are a threshold number away from a hot spot.

16. The apparatus of claim 13, wherein the address circuitry is further configured to remap logical addresses of memory banks of the respective memory die based at least in part on a magnitude of a difference between sensed temperatures.

17. The apparatus of claim 13, further comprising a bus configured to communicate signaling from the first, second, and third plurality of temperature sensors amongst the stack of memory dies.

18. The apparatus of claim 13, wherein at least one of the memory dies of the stack of memory dies is orthogonal relative to an adjacent one of the memory dies of the stack of memory dies.

19. The apparatus of claim 13, wherein the address circuitry is further configured to:
    receive different signaling indicative of a user-defined remapping scheme; and
    remap the logical addresses of the identified memory bank to the non-identified memory bank according to the user-defined remapping scheme.

20. The apparatus of claim 13, wherein the address circuitry is further configured to receive different signaling indicative of whether the remapping is to be permanent.

21. The apparatus of claim 20, wherein the address circuitry is further configured to, in response to the different signaling being indicative of the remapping being permanent, cause a fuse associated with the identified memory bank to be blown.

22. The apparatus of claim 13, wherein the stack of memory dies and the address circuitry comprise a lower-power double data rate synchronous dynamic random access memory.

* * * * *